United States Patent
Hofmann

(10) Patent No.: US 7,336,715 B2
(45) Date of Patent: Feb. 26, 2008

(54) METHOD FOR CODED MODULATION TAKING ACCOUNT OF THE ERROR SENSITIVITY OF THE USER DATA AND ENCRYPTING SAID DATA AFTER CODING

(75) Inventor: Frank Hofmann, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 564 days.

(21) Appl. No.: 10/181,317

(22) PCT Filed: Nov. 10, 2001

(86) PCT No.: PCT/DE01/04222

§ 371 (c)(1),
(2), (4) Date: Oct. 9, 2002

(87) PCT Pub. No.: WO02/41594

PCT Pub. Date: May 23, 2002

(65) Prior Publication Data

US 2003/0091119 A1 May 15, 2003

(30) Foreign Application Priority Data

Nov. 17, 2000 (DE) ................................ 100 57 282

(51) Int. Cl.
*H04K 1/10* (2006.01)
*H04L 27/28* (2006.01)
(52) U.S. Cl. ...................... 375/260; 375/262; 714/778; 714/752
(58) Field of Classification Search ................ 375/260, 375/262; 714/778, 752
See application file for complete search history.

(56) References Cited

U.S. PATENT DOCUMENTS

| 5,548,615 | A | * | 8/1996 | Wei ............................ 375/281 |
| 5,812,601 | A | | 9/1998 | Schramm |
| 6,031,784 | A | | 2/2000 | Ong |
| 6,031,874 | A | | 2/2000 | Chennakeshu et al. |

FOREIGN PATENT DOCUMENTS

| DE | 196 05 418 | 8/1997 |
| EP | 0 490 552 | 6/1992 |

(Continued)

OTHER PUBLICATIONS

Imai H. et al., "A New Multilevel Coding Method Using Error-Correcting Codes," IEEE Transactions on Information Theory, 1977, pp. 371-377.

(Continued)

*Primary Examiner*—David C. Payne
*Assistant Examiner*—Nader Bolourchi
(74) *Attorney, Agent, or Firm*—Kenyon & Kenyon LLP

(57) ABSTRACT

A method of coded modulation of digital data is described, the digital data being divided into parallel signal streams, and the useful bits then being channel coded at different code rates according to their error susceptibility. The useful bits channel coded differently in this way are then scrambled separately in time. The different code rates used and the respective number per transmission frame of the useful bits channel coded at different code rates are signaled to the receivers, so that the receiver is able to perform the descrambling and channel decoding.

8 Claims, 2 Drawing Sheets

FOREIGN PATENT DOCUMENTS

| | | |
|---|---|---|
| EP | 0 540 232 | 5/1993 |
| HU | 216370 | 6/1999 |
| JP | 6-292160 | 10/1994 |
| JP | 10-41830 | 2/1998 |
| TW | 83106551 | 7/1994 |
| WO | WO 02/41594 | 5/2002 |

OTHER PUBLICATIONS

Yakhno T.M. et al., "Using the ECL I PS E Interval Domain Library in CAD," The ICL Systems Journal, Nov. 1997, pp. 330-348.

P. Schramm, "Multilevel coding with independent decoding on levels for efficient communication on static and scrambled facing channels," Personal Indoor and Mobile Radio Communication Waves of the Year 2000, PRMRC 1997, 8$^{th}$ IEEE International Symposium, Sep. 1-4, 1997, pp. 1196-1200, vol. 3.

Udo Wachsmann, et al. "Conditions on the Optimality of Multilevel Codes", Proceedings 1997 IEEE International Symposium on Information Theory, Jun. 29-Jul. 4, 1997, Ulm, Germany, p. 266.

* cited by examiner

METHOD FOR CODED MODULATION TAKING ACCOUNT OF THE ERROR SENSITIVITY OF THE USER DATA AND ENCRYPTING SAID DATA AFTER CODING

FIELD OF THE INVENTION

The present invention relates to a method of coded modulation.

BACKGROUND INFORMATION

Coded modulation may be used to jointly optimize the channel for coding and modulation. The term multilevel coding is equivalent to coded modulation. Source coding for data reduction may be performed before coded modulation.

SUMMARY OF THE INVENTION

An example method according to the present invention for coded modulation may provide that a non-uniform error protection is used in coded modulation, using different code rates for useful bits having a different error susceptibility. The code rate and number of useful bits to be coded may be selected independently of one another.

An example method according to the present invention may permit a simpler implementation on the whole.

The useful bits, each channel coded at different code rates, may be distributed among parallel scramblers for scrambling chronologically and may be subsequently combined back into one signal stream by a multiplexer. Thus, only the useful bits that have been channel coded at the same code rate may also be scrambled together. The channel decoding and descrambling which precede channel decoding in the receiver may thus be accordingly simple.

As an alternative, a scrambler may be used per each division step of coded modulation downstream from the coder to scramble the useful bits channel coded at different code rates separately and in succession chronologically. Thus, a scrambler may be used which has the required intelligence to divide the useful bits channel coded at different code rates into corresponding groups and then scramble them chronologically.

The at least two different code rates used for channel coding and the respective number of useful bits channel coded at different code rates may be signaled to the receiver. Thus, the receiver may be able to determine the code rates at which the useful bits having different error susceptibilities have been channel coded and the number of differently coded useful bits for implementing a corresponding descrambling and channel coding correctly.

Both a transmitter and a receiver may have an arrangement for implementing the example method according to the present invention.

DETAILED DESCRIPTION

The Digital Radio Mondiale (DRM) digital transmission system for transmission bands of less than 30 MHz may be currently developed. Therein, a multilevel coding (MLC) may be used as the channel coding. The channel coding and modulation may be optimized jointly, which may be why this may also be referred as coded modulation. Channel coding may add redundancy to data so that transmission errors may be detected and optionally corrected.

In a higher-level modulation method having a q-nary signal constellation, the signal alphabet has exactly q values. The basis for MLC (multilevel coding) is the partitioning of the signal alphabet into subsets. Each division step of the multilevel coding is assigned one component of the address vector of the signal space representation. Each component is protected with its own code here. If we consider a $2^m$-step signal constellation, this yields a division into n steps, if m=n, according to address vector c $(=c_0, c_1, \ldots, c_{n-1})$. Steps m of modulation need not necessarily be equal to the number of division steps if using 64-QAM (quadrature amplitude modulation).

Figure 1:
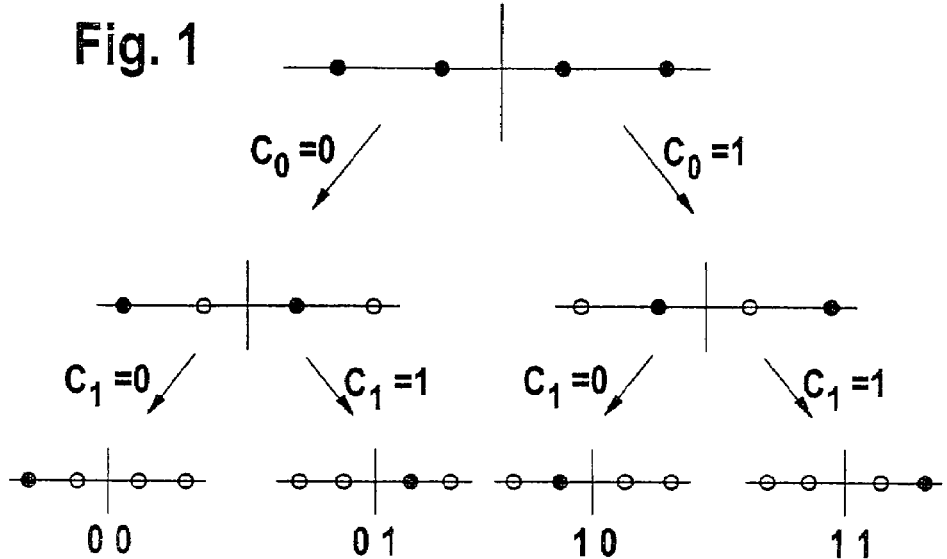
FIG. 1 illustrates partitioning of 4-ASK.

FIG. 1 illustrates partitioning of 4-ASK (amplitude shift keying). Four states are thus coded in 4-ASK. The data stream is coded with n parallel coders, and code $c_0$ has the lowest code rate $R_0$, i.e., it may add the greatest redundancy and may protect the position of the address vector most susceptible to errors. Four states represented by solid circles are shown on the top state bar in FIG. 1. Individual codable states are arrived at in 4-ASK via the two middle state bars. The first division step becomes either $c_0=0$ or $c_0=1$. Accordingly, the four solid circles are distributed among two numerical bars having complementary solid and empty circles. In the four bottom state bars, the individual states in 4-ASK are coded, namely 00, 01, 10 and 11. State 00 has one solid circle at the far left, followed by three empty circles. State 01 has a solid circle in third place from the left. State 10 has the solid circle in second place from the left, and state 11 has the solid circle at the far right. The other positions are represented by empty circles for a 0.

Figure 2:
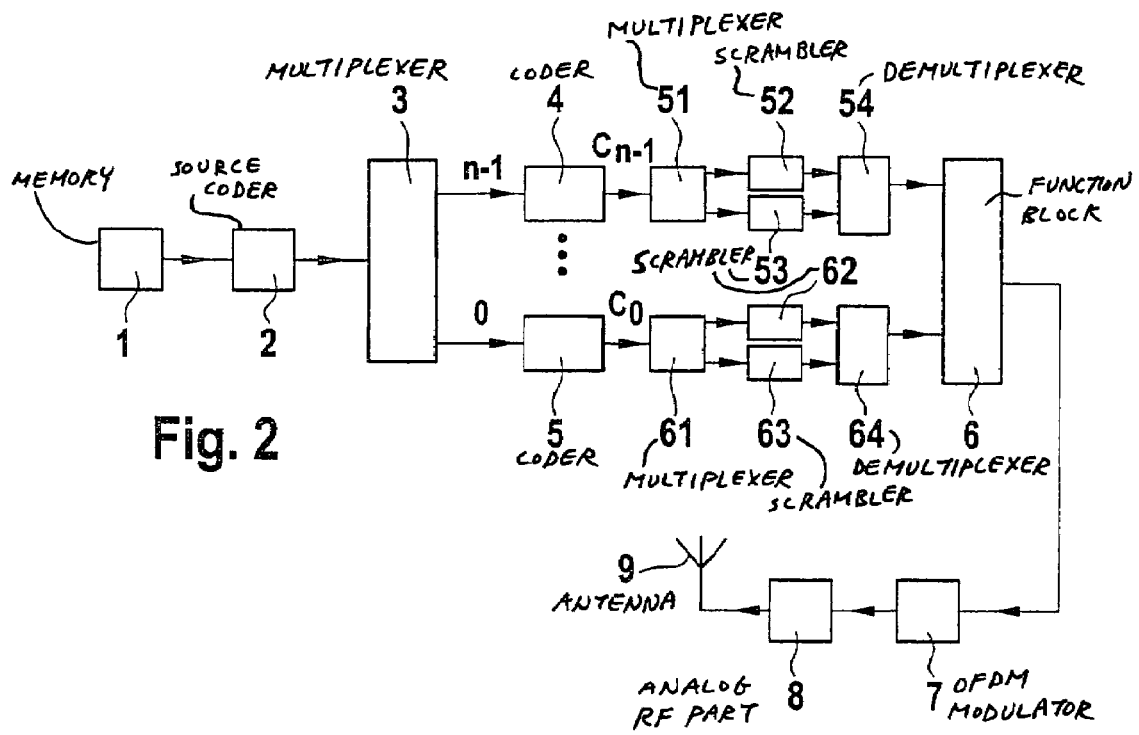
FIG. 2 shows a block diagram of the transmitter according to an example embodiment of the present invention.

FIG. 2 shows a block diagram of the transmitter according to an example embodiment of the present invention. Data to be sent using the transmitter according to the present invention is stored in data memory 1. However, other data sources may also be used here. This data is then transmitted from data memory 1 to a source coder 2 which performs source coding to reduce the amount of data to be transmitted. The data thus source coded together with the useful bits is then transmitted to a bit multiplexer 3 which distributes the data stream among n parallel lines. A coder which channel codes one of the data streams $(q_0 \ldots q_{n-1})$ is connected to each of these n lines numbered continuously 0 through n−1. For example, a coder 5 is shown here in line 0, and a coder 4 in line n−1. Signals $c_0$ and $c_{n-1}$ are available here at the output of the respective coder. Coders 4 and 5 perform channel coding by using a convolution coding and thus add redundancy back to the useful bits. Coders 4 and 5 use two different code rates here. Source coder 2 has identified the useful bits which require a first error protection and the remaining useful bits which require a second error protection. To do so, channel coders 4 and 5 then each use a different code rate. The useful bits are thus distributed among the division steps according to specified rules without an analysis of the useful bits in this regard. First the useful bits are distributed among the division steps and coders 4 and 5 which are channel coded with the first code rate, and then these are followed by useful bits channel coded at the second code rate. To do so, the code rate on all available coders is switched.

Since differently channel-coded useful bits are now available at the output of coders 4 and 5, they are scrambled chronologically separately in downstream scramblers. A multiplexer 61 downstream from coder 5 and likewise a multiplexer 51 downstream from coder 4 distribute the differently coded useful bits among scramblers 62 and 63 as well as 52 and 53. The term scrambler originates from English. Scrambling indicates that bits which are close together in time and contain information having a high correlation with adjacent bits are separated from one another in time to allow correction of as many errors as possible on the receiving end in the case of a burst error having channel decoding to minimize the number of audible errors. Scrambled useful bits are then combined again into one signal stream in demultiplexer 54, starting from scramblers 52 and 53. Scrambled useful bits of scramblers 62 and 63 are combined again to form one signal stream in demultiplexer 64 by analogy.

Data thus channel coded is then assigned to signal space points in block 6 to then generate the respective modulation symbols.

Convolution codes having punctuation are used as the component codes in individual coders 4 and 5. In MLC (multilevel coding), at least two different code rates are used for each division step here. After modulation in function block 6, signaling data is added to the signal stream, signaling to a receiver which different code rates have been used for channel coding and how many bits per frame have been channel coded at the first code rate and how many bits have been channel coded at the second code rate. A receiver may then perform correct demodulation and descrambling as well as channel decoding.

Then in FIG. 2 the modulation symbols thus coded are transmitted from function block 6 to OFDM (orthogonal frequency division multiplex) modulator 7, which distributes the individual modulation symbols to frequency carriers which are arranged close together and are mutually orthogonal. The resulting OFDM signals are then mixed in an analog RF part 8, amplified and then sent out using an antenna 9.

Figure 3:
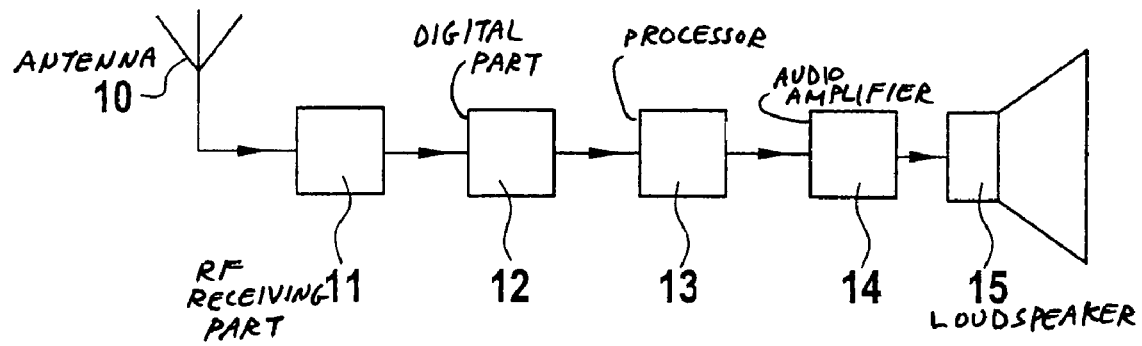
FIG. 3 shows a block diagram of the receiver according to an example embodiment of the present invention.

FIG. 3 shows a block diagram of the receiver according to an example embodiment the present invention. An antenna 10 for receiving the OFDM signals is connected to an input of an RF receiving part 11. RF receiving part 11 converts the received signals into an intermediate frequency, amplifies them and filters them. In addition, RF receiving part 11 transmits these signals to a digital part 12 which digitizes the received signals and performs OFDM demodulation. The modulation symbols obtained in this manner are then demodulated in processor 13, subjected to descrambling, channel decoding and source decoding to convert them to analog signals. The analog signals are then amplified by an audio amplifier 14 to ultimately be played back via loudspeaker 15. In particular the signaling data indicating the two code rates used and the number of useful bits per frame for a code rate is used after analysis. A receiver may then perform a correct descrambling and channel decoding.

Instead of two code rates, multiple code rates may be used. Instead of source coder 2, bit multiplexer 3 may also decide which bits are to be channel coded at which code rate. This may also be assigned as a task to a higher-level processor which is provided in the transmitter according to an example embodiment of the present invention. As an alternative, multimedia data may be received which is then played back visually.

Figure 4:
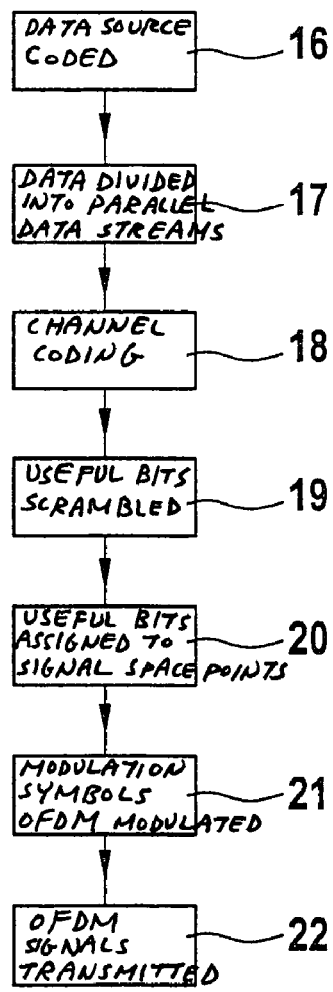
FIG. 4 shows a flow chart of an example method according to the present invention.

FIG. 4 illustrates an example method according to the present invention for coded modulation in the form of a flow chart. In method step 16, data is made available by data memory 1 and subjected to source coding by source coder 2. In addition, source coder 2 here determines which useful bits are channel coded at which code rate. Non-uniform error protection may thus be established. In method step 17 the resulting data stream is divided into parallel data streams by bit multiplexer 3. As an alternative, bit multiplexer 3 may perform the division of useful bits for the different channel coding. In method step 18, individual coders 4 and 5 perform the channel coding. The useful bits are channel coded at two different code rates, as defined by source coder 2. Useful bits, which are thus channel coded differently, are scrambled chronologically in method step 19. Only useful bits which have been channel coded at the same code rate are scrambled chronologically. This may be accomplished either by parallel-connected scramblers or by an intelligent scrambler which sequentially scrambles useful bits channel coded at different code rates separately from one another. In method step 20, the channel-coded useful bits thus formed are assigned to signal space points to generate the modulation symbols in function block 6. In method step 21 the modulation symbols are subjected to OFDM modulation, and in method step 22 the OFDM signals are amplified and transmitted. In addition, the two different code rates for the useful bits and the number of useful bits per code rate used per transmission frame are also transmitted as signaling from the transmitter to the receive, so the receivers are capable of descrambling and channel decoding the differently channel-coded useful bits.

What is claimed is:

1. A method of coded modulation of digital data having useful bits, comprising:
   identifying at least two different error susceptibilities of the useful bits;
   dividing the useful bits into parallel signal streams;
   channel coding at least two different parts of each signal stream according to at least two different code rates by a coder, the at least two different code rates being selected as a function of the at least two different error susceptibilities of the useful bits in the at least two different parts of each signal stream;
   scrambling temporally the useful bits channel coded at a first code rate of the at least two different code rates separately from the useful bits channel coded at a second code rate of the at least two different code rates; and
   assigning the channel-coded and scrambled useful bits to signal space points to generate modulation symbols.

2. The method according to claim 1, further comprising:
   distributing, prior to the scrambling, the useful bits channel coded at the at least two different code rates among parallel scramblers for scrambling temporally; and
   subsequent to the scrambling, combining the distributed useful bits back into one signal stream by a demultiplexer.

3. The method according to claim 1, wherein the scrambling is performed downstream from the coder using a scrambler.

4. The method according to claim 1, further comprising:
   signaling to a receiver the at least two different code rates and a respective number of the useful bits channel coded at the at least two different code rates.

5. A transmitter for coded modulation of digital data having useful bits, comprising:
   a first multiplexer for distributing the useful bits;
   a coder for channel coding two different groups of the distributed useful bits at two different code rates selected as a function of two different error susceptibilities of the two different groups of the useful bits;
   a scrambling unit for scrambling the useful bits temporally, wherein the useful bits channel coded at a first code rate of the two different code rates are temporally scrambled separately from the useful bits channel coded at a second code rate of the two different code rates; and an arrangement for assigning the channel-coded, scrambled useful bits to signal space points.

6. The transmitter according to claim 5, wherein the scrambling unit includes a scrambler.

7. The transmitter according to claim 5, further comprising:

a second multiplexer connected to the coder downstream from the coder;

wherein the scrambling unit is connected to the second multiplexer downstream from the second multiplexer; and a demultiplexer connected to the scrambling unit downstream from the scrambling unit, for combining the useful bits channel coded at the two different code rates.

8. A receiver for receiving and decoding parallel signal streams of useful bits, wherein at least two different parts of each signal stream are channel coded using at least two different code rates, and the useful bits channel coded at a first code rate of the at least two different code rates are temporally scrambled separately from the useful bits channel coded at a second code rate of the at least two different code rates, comprising:

an arrangement for receiving the parallel signal streams of useful bits;

an arrangement for channel decoding each received signal stream at the at least two different code rates, wherein the at least two different code rates for the useful bits are dependent on at least two different error susceptibilities of the useful bits in the at least two different parts of each signal stream; and an arrangement for descrambling connected to the arrangement for channel decoding.

* * * * *